US012328945B2

United States Patent
Hino (10) Patent No.: US 12,328,945 B2
(45) Date of Patent: Jun. 10, 2025

(54) SEMICONDUCTOR INTEGRATED CIRCUIT DEVICE

(71) Applicant: Socionext Inc., Kanagawa (JP)

(72) Inventor: Toshio Hino, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 442 days.

(21) Appl. No.: 17/945,800

(22) Filed: Sep. 15, 2022

(65) Prior Publication Data

US 2023/0027616 A1 Jan. 26, 2023

Related U.S. Application Data

(63) Continuation of application No. PCT/JP2020/014206, filed on Mar. 27, 2020.

(51) Int. Cl.
  *H10D 89/10* (2025.01)
  *H01L 23/528* (2006.01)

(52) U.S. Cl.
  CPC ........... *H10D 89/10* (2025.01); *H01L 23/528* (2013.01)

(58) Field of Classification Search
  CPC ........ H10D 89/10; H10D 84/01; H10D 12/01; H10D 62/378; H10D 84/998; H10D 88/00; H10D 30/00; H10D 30/62; H10D 84/00; H01L 23/528
  See application file for complete search history.

(56) References Cited

U.S. PATENT DOCUMENTS

| | | | | |
|---|---|---|---|---|
| 5,223,733 A | * | 6/1993 | Doi | H01L 23/5225 257/659 |
| 5,859,449 A | * | 1/1999 | Kobayashi | H01L 27/0207 257/210 |
| 9,645,604 B1 | * | 5/2017 | Nebesnyi | G06F 1/12 |
| 2006/0131612 A1 | * | 6/2006 | Kishishita | H10D 84/90 257/E21.582 |
| 2006/0220255 A1 | * | 10/2006 | Oba | G06F 30/394 257/773 |
| 2009/0026503 A1 | | 1/2009 | Tsuda | |
| 2010/0037191 A1 | | 2/2010 | Kosuge | |
| 2011/0049575 A1 | * | 3/2011 | Tanaka | H01L 27/11807 257/E27.013 |
| 2012/0018839 A1 | | 1/2012 | Tsuda | |

(Continued)

FOREIGN PATENT DOCUMENTS

| | | |
|---|---|---|
| JP | H06-029392 A | 2/1994 |
| JP | H11-345881 A | 12/1999 |

(Continued)

OTHER PUBLICATIONS

International Search Report (ISR) dated Jul. 7, 2020 issued in International Patent Application No. PCT/JP2020/014206 with partial English translation.

(Continued)

*Primary Examiner* — Galina G Yushina
(74) *Attorney, Agent, or Firm* — Rimon P.C.

(57) ABSTRACT

A semiconductor integrated circuit device includes a clock buffer cell that is a standard cell transmitting a clock signal. The clock buffer cell has an input terminal and an output terminal. A first metal interconnect including the output terminal is located in a layer above a second metal interconnect including the input terminal and greater in width than the second metal interconnect.

13 Claims, 9 Drawing Sheets

(56) References Cited

U.S. PATENT DOCUMENTS

2014/0252650 A1* 9/2014 Utsumi .............. H01L 23/5286
                                                        257/774
2019/0304875 A1* 10/2019 Yokoyama .......... H01L 25/0657

FOREIGN PATENT DOCUMENTS

| JP | 2004-289030 A | 10/2004 |
| JP | 2008-130788 A | 6/2008 |
| JP | 2008-311570 A | 12/2008 |
| JP | 2009-049370 A | 3/2009 |
| JP | 2010-039817 A | 2/2010 |
| JP | 2011-049477 A | 3/2011 |
| JP | 2014-067811 A | 4/2014 |
| JP | 2014-103254 A | 6/2014 |
| JP | 2015-075973 A | 4/2015 |
| JP | 2019-079950 A | 5/2019 |

OTHER PUBLICATIONS

Written Opinion dated Jul. 7, 2020 issued in International Patent Application No. PCT/JP2020/014206 with partial English translation.

* cited by examiner

SEMICONDUCTOR INTEGRATED CIRCUIT DEVICE

CROSS-REFERENCE TO RELATED APPLICATIONS

This is a continuation of International Application No. PCT/JP2020/014206 filed on Mar. 27, 2020. The entire disclosure of this application is incorporated by reference herein.

BACKGROUND

The present disclosure relates to a semiconductor integrated circuit device provided with a clock buffer cell.

In recent years, with the miniaturization of semiconductor devices, speedup of circuits and, in turn, increase in power consumption are proceeding. To keep up with the circuit speedup, it is important to transmit a clock signal to flipflops, etc. with reduced clock skew. To reduce the clock skew, increasing the drive capability of a clock buffer that transmits a clock signal is conducted. With increase in the drive capability of the clock buffer, however, a large current flows to the power supply for the clock buffer, and besides a large current also flows to the input/output terminals of the clock buffer. This makes obvious the problems of a power supply voltage drop (IR drop) and electromigration (EM).

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through lines, thereby designing an LSI chip.

Japanese Unexamined Patent Publication No. H11-345881 discloses a technique in which power supply lines for standard cells for clock buffers and those for other standard cells are formed in different interconnect layers from each other.

In the technique of the cited patent document, however, although the power supply voltage drop can be reduced, the configuration of power supply lines becomes complicated, causing a problem of taking a larger number of man-hours to design a semiconductor integrated circuit. Also, the technique of the cited patent document fails to solve the problem of electromigration at the input/output terminals of a clock buffer.

An objective of the present disclosure is providing a semiconductor integrated circuit device provided with a clock buffer cell in which the problems of a power supply voltage drop and electromigration can be controlled without complicating the configuration of power supply lines.

SUMMARY

According to the first mode of the present disclosure, a semiconductor integrated circuit device includes a clock buffer cell that is a standard cell transmitting a clock signal, having an input terminal and an output terminal, wherein a first metal interconnect including the output terminal is located in a layer above a second metal interconnect including the input terminal and greater in width than the second metal interconnect.

According to the above mode, in the clock buffer cell, the first metal interconnect including the output terminal is located in a layer above the second metal interconnect including the input terminal and greater in width than the second metal interconnect. In a clock buffer, the output terminal is larger in load capacitance than the input terminal, causing a larger current to flow to the output terminal than to the input terminal, and therefore the electromigration problem is more likely to occur at the output terminal. In view of this, by placing the output terminal in a layer above the input terminal, the number of transfers from one interconnect layer to another in the routing of connected lines is reduced, whereby the number of lines in which the electromigration problem may occur can be reduced. Also, by making the width of the output terminal greater than that of the input terminal, the electromigration problem at the output terminal can be controlled.

According to the second mode of the present disclosure, a semiconductor integrated circuit device includes: a first power supply line supplying a first power extending in a first direction in a first metal interconnect layer; a first standard cell implementing a logical function connected to the first power supply line; and a clock buffer cell that is a standard cell transmitting a clock signal, connected to the first power supply line, wherein the clock buffer cell includes a second power supply line formed in a second metal interconnect layer above the first metal interconnect layer and electrically connected to the first power supply line, and the second power supply line is greater in width than the first power supply line.

According to the above mode, the clock buffer cell receives power supply from the first power supply line in the first metal interconnect layer as does the first standard cell. The clock buffer cell also receives power supply from the second power supply line formed in the second metal interconnect layer located above the first metal interconnect layer. The second power supply line is greater in width than the first power supply line. Therefore, even when a large current flows to the clock buffer cell, such a current is mainly supplied from the second power supply line lower in resistance value. This minimizes the power supply voltage drop and also can minimize the influence on the power supply for the first standard cell.

According to the third mode of the present disclosure, a semiconductor integrated circuit device includes: a plurality of first power supply lines supplying a first power extending in a first direction; a plurality of second power supply lines supplying a second power extending in the first direction, the plurality of first power supply lines and the plurality of second power supply lines being alternately placed in a second direction vertical to the first direction; and a clock buffer cell that is a standard cell transmitting a clock signal, formed in a region in which the plurality of first power supply lines and the plurality of second power supply lines are placed, the clock buffer cell having an input terminal and an output terminal, wherein the clock buffer cell includes a plurality of buffer portions arranged in line in the second direction, each having an input node electrically connected to the input terminal and an output node electrically connected to the output terminal, the input nodes and the output nodes are formed in a first metal interconnect layer, and the output terminal is formed in a second metal interconnect layer above the first metal interconnect layer, and, when the plurality of buffer portions are 2N (N is a positive integer) buffer portions, the output terminal is located between the N-th buffer portion and the (N+1)th buffer portion from one side in the second direction, and when the plurality of buffer portions are (2N+1) buffer portions, the output terminal is located at a position overlapping the N-th buffer portion from one side in the second direction, as viewed in plan.

According to the above mode, the clock buffer cell is formed in a region where the first power supply line supplying the first power and the second power supply line supplying the second power are alternately placed. The clock buffer cell includes a plurality of buffer portions arranged in line in the second direction vertical to the first direction in which the first and second power supply lines extend. The buffer portions each include the input node electrically connected to the input terminal of the clock buffer cell and the output node electrically connected to the output terminal of the clock buffer cell. The output terminal of the clock buffer cell is formed in the second metal interconnect layer located above the first metal interconnect layer in which the input nodes and output nodes of the buffer portions are formed. Also, when the number of buffer portions is 2N, the output terminal is located between the N-th and (N+1)th buffer portions, and when it is (2N+1), the output terminal is located at a position overlapping the N-th buffer portion, as viewed in plan. That is, the output terminal of the clock buffer cell is located near the center of the plurality of buffer portions in the second direction. With this configuration, the currents flowing from the buffer portions to the output terminal result in flowing from both sides in the Y direction roughly uniformly with no occurrence of having a larger current flowing from one side. Therefore, the electromigration problem can be controlled According to the present disclosure, in a semiconductor integrated circuit device provided with a clock buffer cell, the problems of a power supply voltage drop and electromigration can be controlled without complicating the configuration of power supply lines.

DETAILED DESCRIPTION

An embodiment of the present disclosure will be described hereinafter with reference to the accompanying drawings. Note herein that "VDD" and "VSS" are used as symbols representing both the power supplies themselves and the power supply voltages applied by the power supplies. Also, the source and drain of a transistor are herein collectively called the "nodes" of the transistor as appropriate. Note also that a standard cell is simply called a cell as appropriate.

While the semiconductor integrated circuit device is assumed to include fin transistors in the following description, the structure of transistors included in the semiconductor integrated circuit device according to the present disclosure is not limited to the fin type.

Figure 1:
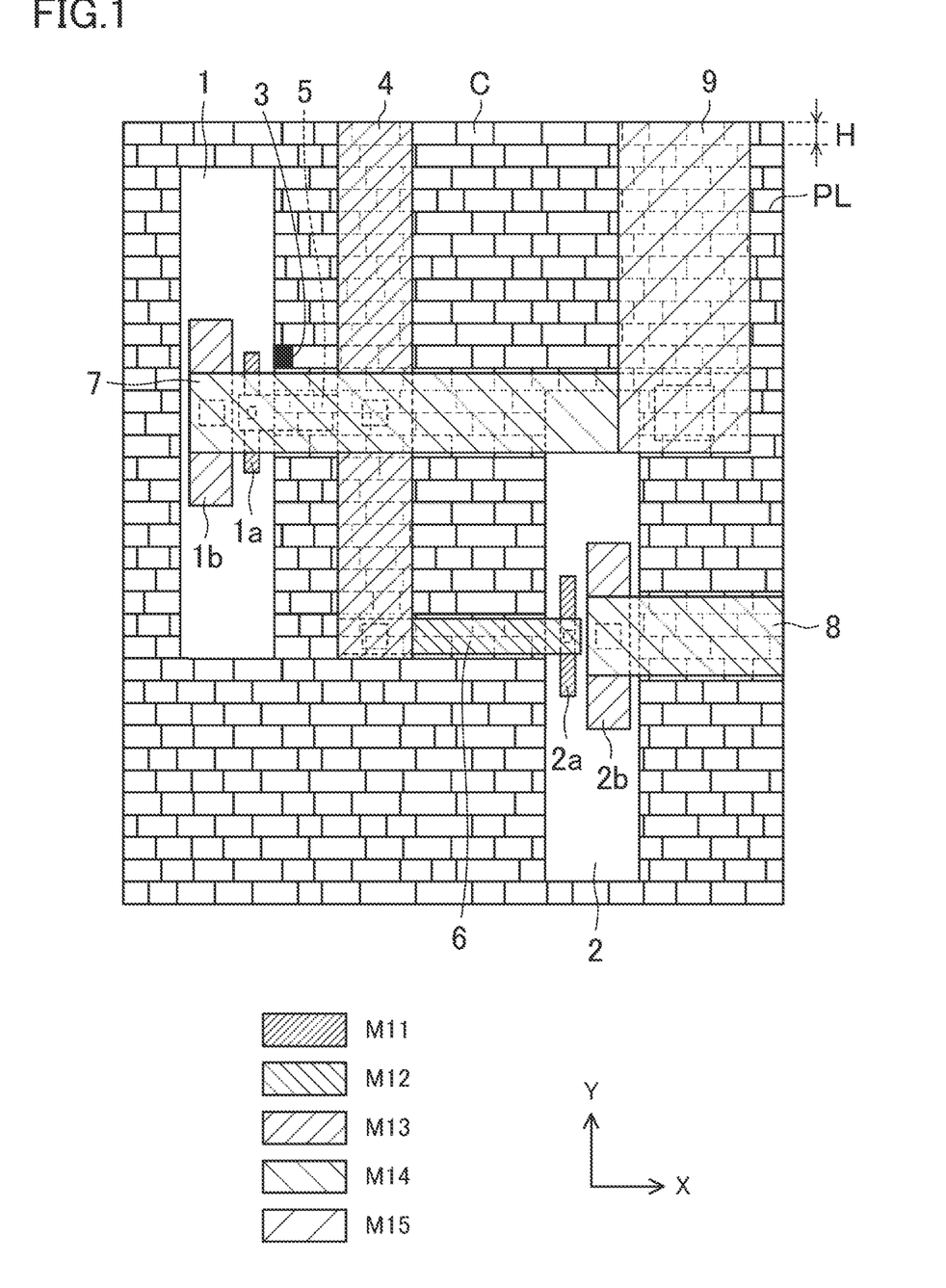
FIG. 1 shows a block layout example of a semiconductor integrated circuit device according to an embodiment.

FIG. 1 shows a block layout example of the semiconductor integrated circuit device according to this embodiment. In FIG. 1, the bold lines extending in parallel in an X direction (corresponding to the first direction) represent power supply lines PL. As the power supply lines PL, power supply lines supplying VDD and power supply lines supplying VSS are placed alternately in a Y direction (corresponding to the second direction). Regions between adjacent power supply lines PL in the Y direction are herein called height regions, which have a height H. Standard cells C are placed in the height regions. In FIG. 1, the standard cells C are shown by rectangular frames in a simplified manner. Most standard cells C shown in FIG. 1 are single-height cells having a height equal to H.

In the block layout of FIG. 1, two clock buffer cells 1 and 2 are placed as cells other than the normal standard cells C. The clock buffer cells 1 and 2 are multi-height cells having a height of a multiple of H. In FIG. 1, the clock buffer cells 1 and 2 have a height 22 times that of the normal standard cells C. A 2-input NAND cell 3 as an example of the normal standard cells is placed near the clock buffer cell 1.

Figure 2:
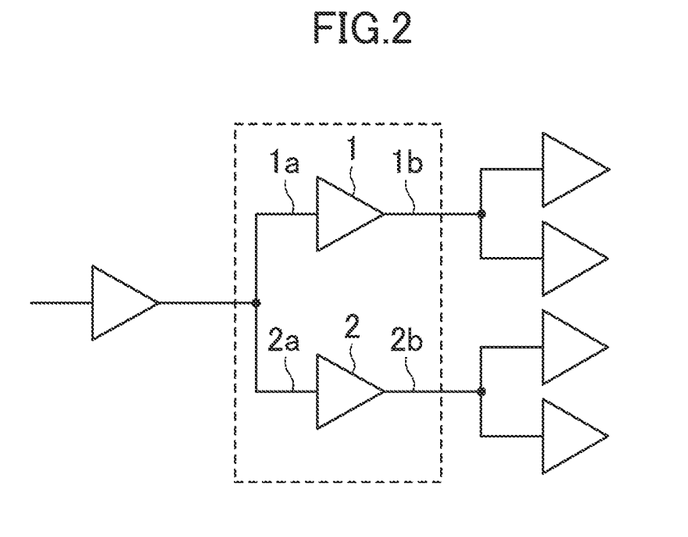
FIG. 2 is a circuit diagram of a clock tree including clock buffer cells.

FIG. 2 is a circuit diagram of a clock tree including the clock buffer cells 1 and 2. As shown in FIG. 2, the clock buffer cells 1 and 2 receive a common clock signal output from a preceding clock buffer cell at their input terminals 1a and 2a, respectively. The clock buffer cell 1 outputs a buffered clock signal from its output terminal 1b, and the clock buffer cell 2 outputs a buffered clock signal from its output terminal 2b.

In FIG. 1, an M13 interconnect 4 extending in the Y direction corresponds to the output line of the preceding clock buffer cell. The M13 interconnect 4 is connected to the input terminal 1a of the clock buffer cell 1 through an M12 interconnect 5 extending in the X direction. The M13 interconnect 4 is also connected to the input terminal 2a of the clock buffer cell 2 through an M12 interconnect 6 extending in the X direction. The output terminal 1b of the clock buffer cell 1 is connected to an M15 interconnect 9 extending in the Y direction through an M14 interconnect 7 extending in the X direction. The output terminal 2b of the clock buffer cell 2 is connected to an M14 interconnect 8 extending in the X direction.

Figure 3:
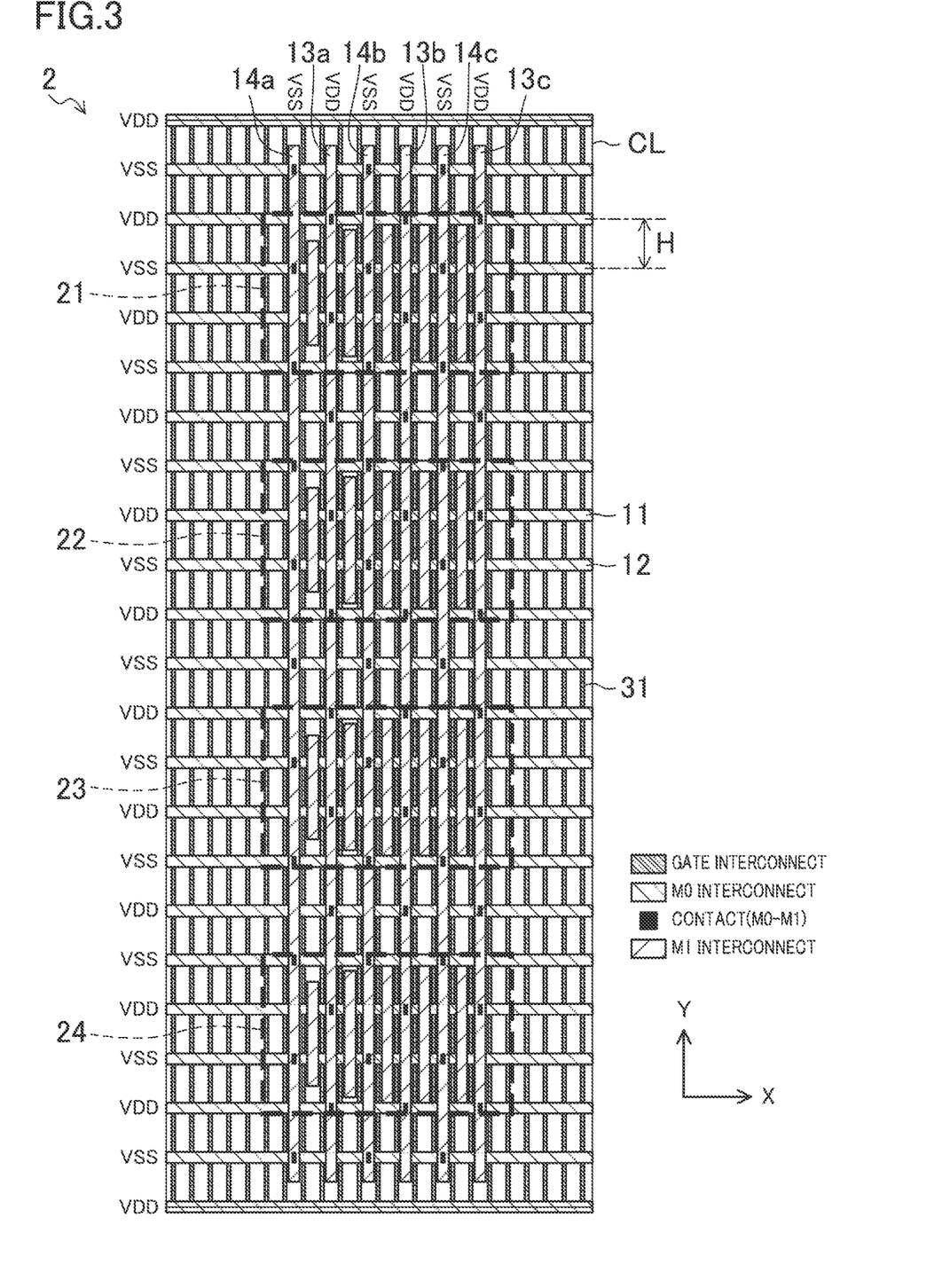
FIG. 3 shows a layout example of a clock buffer cell.
Figure 4:
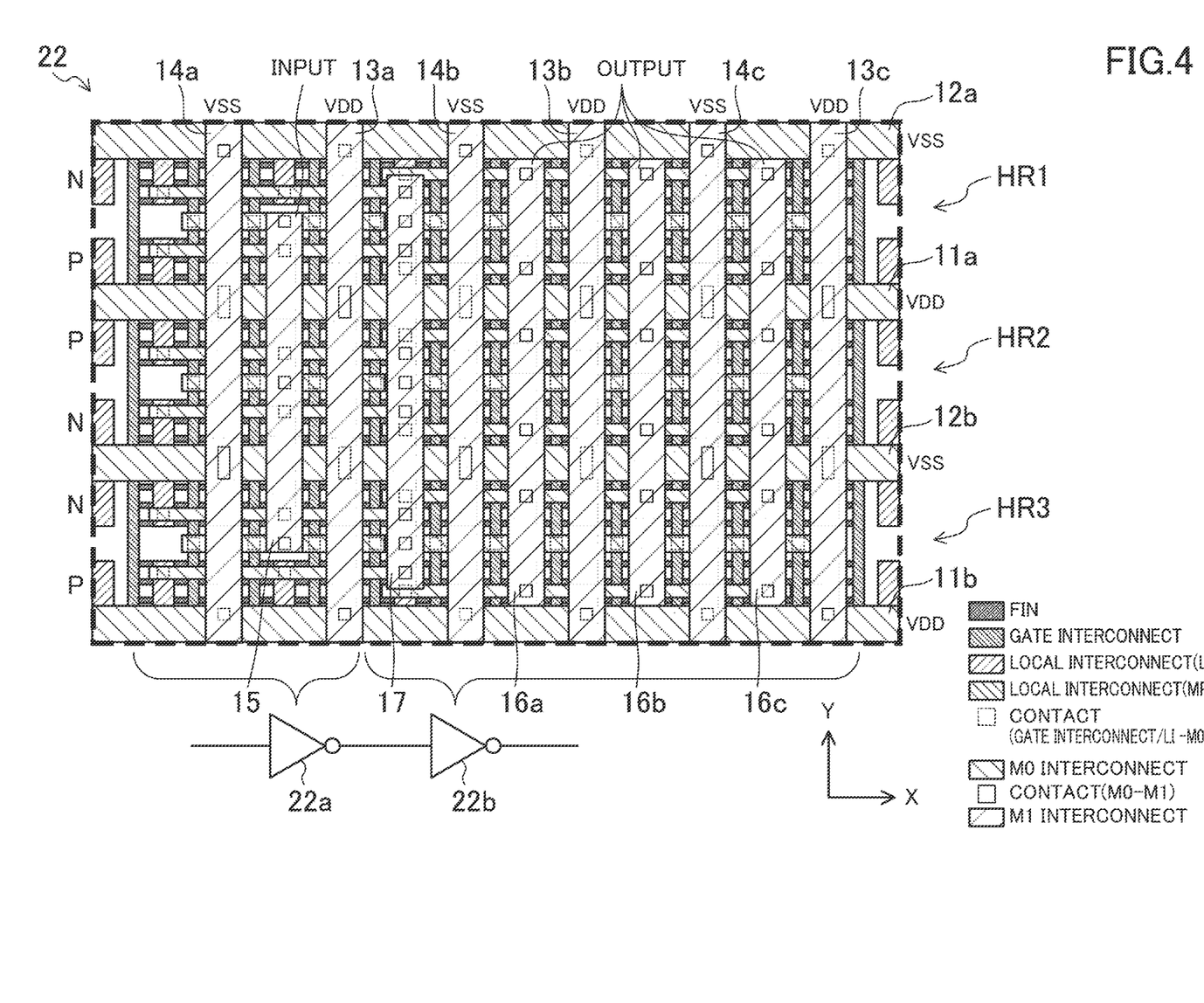
FIG. 4 shows a layout of a buffer portion of the clock buffer cell of FIG. 3.
Figure 5:
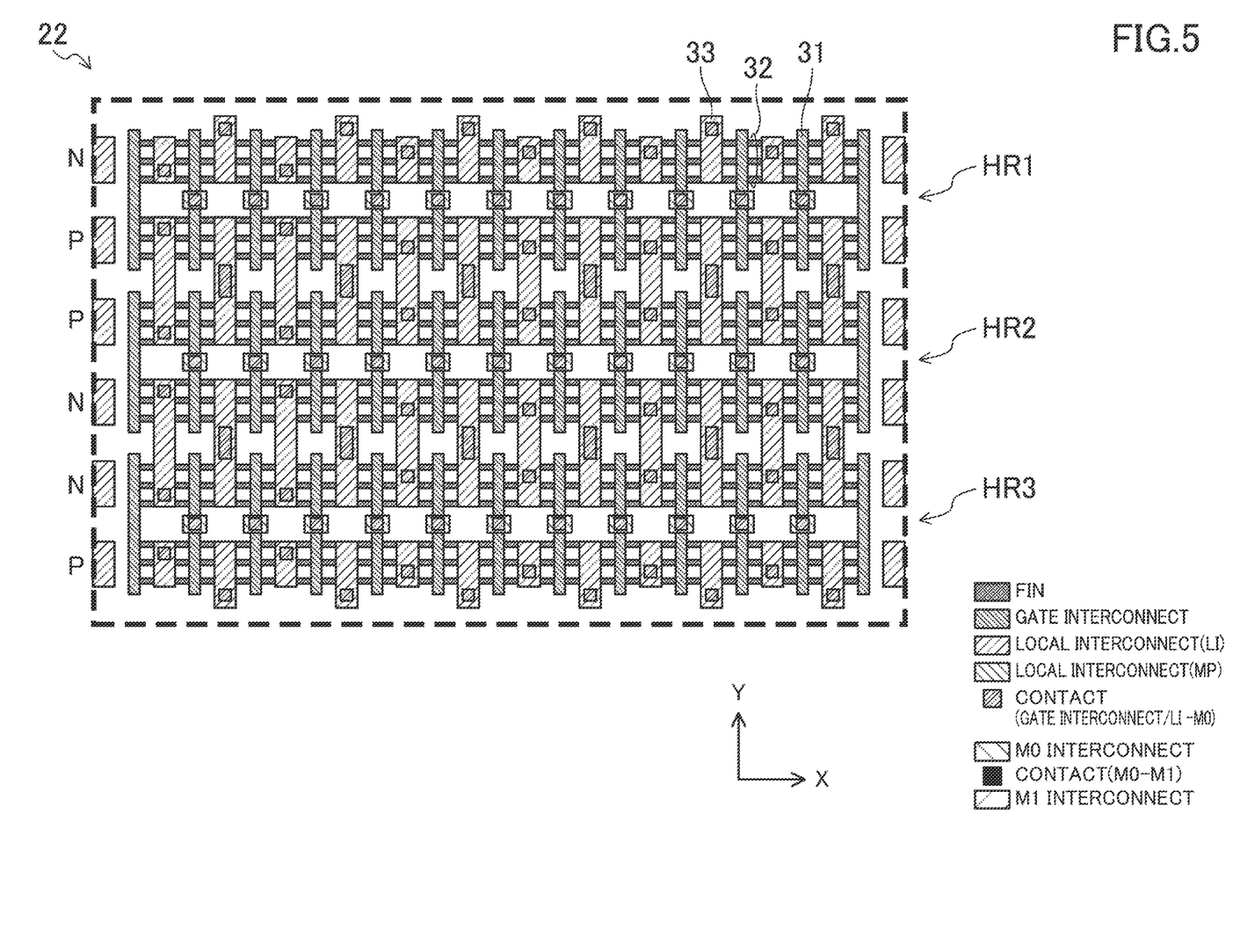
FIG. 5 shows a layout of a lower part of the buffer portion of FIG. 4.
Figure 6:
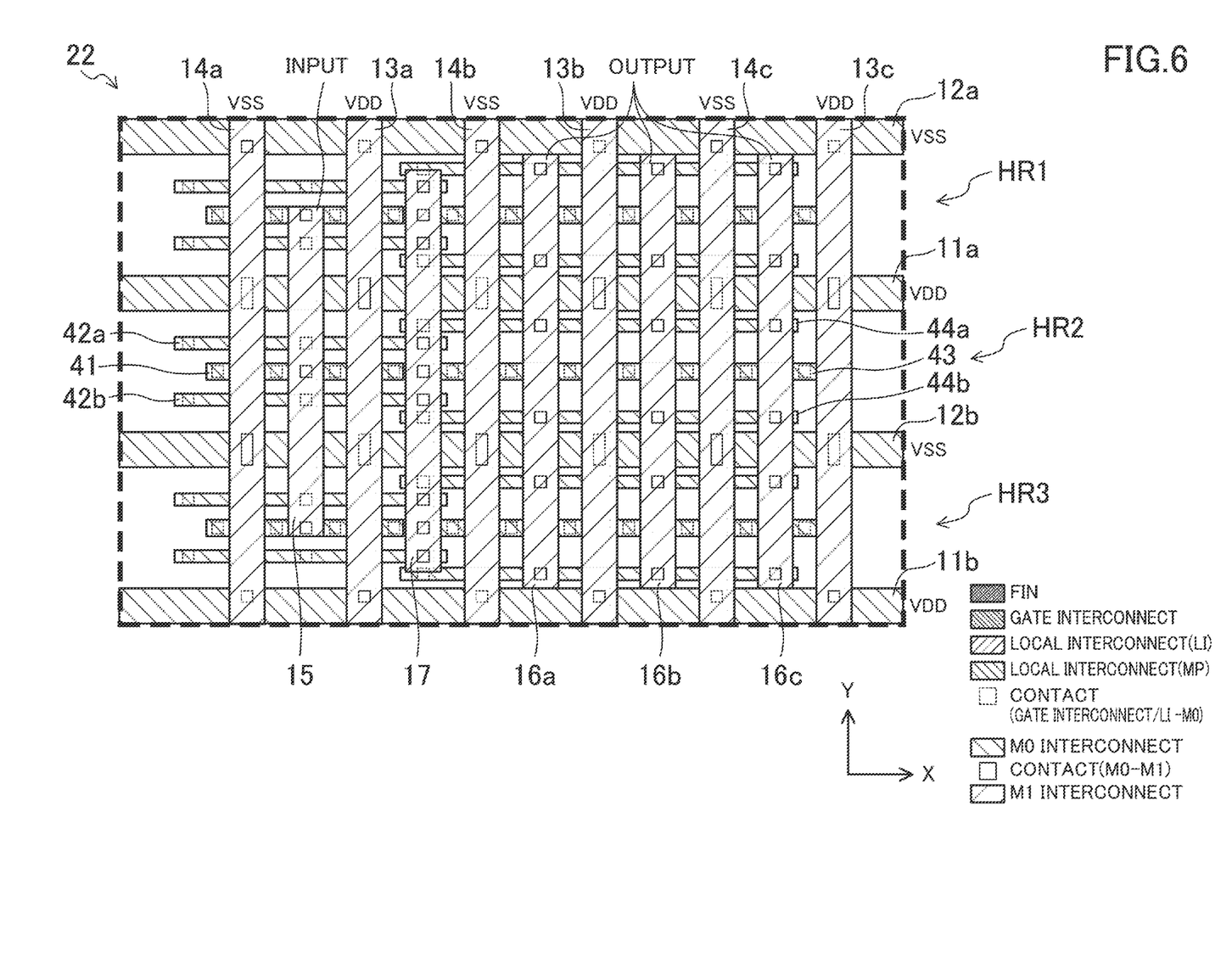
FIG. 6 shows a layout of an upper part of the buffer portion of FIG. 4.

FIG. 3 is a schematic diagram showing a layout example of the clock buffer cell 2. FIG. 4 shows a layout of a buffer portion of the clock buffer cell of FIG. 3, FIG. 5 shows a layout of a lower part of the buffer portion of FIG. 4, and FIG. 6 shows a layout of an upper part of the buffer portion of FIG. 4.

In this embodiment, the transistors constituting the clock buffer cells and other cells are assumed to be fin transistors. Note however that, in the layout of FIG. 3, illustration of fins and local interconnects of the fin transistors is omitted, and only gates 31 are illustrated, for easy viewing of the figure. CL denotes the cell limits.

In the layout of FIG. 3, in an M0 interconnect layer, power supply lines 11 supplying VDD and power supply lines 12 supplying VSS, both extending in the X direction, are alternately placed in the Y direction. Four buffer portions 21, 22, 23, and 24 are arranged in line in the Y direction. The buffer portions 21, 22, 23, and 24 have a height of 3H and have a spacing of 2H between the adjacent ones. Decoupling capacitive portions are formed around the buffer portions 21, 22, 23, and 24. The decoupling capacitive portions form capacitances between VDD and VSS, thereby reducing the power supply voltage drop.

In an M1 interconnect layer, power supply lines 13a, 13b, and 13c supplying VDD and power supply lines 14a, 14b, and 14c supplying VSS, both extending in the Y direction, are alternately placed in the X direction. The power supply lines 13a, 13b, 13c, 14a, 14b, and 14c extend over the four buffer portions 21, 22, 23, and 24.

The layout of the buffer portions will be described with reference to FIGS. 4 to 6. Note that, while the buffer portion 22 is taken as an example in FIGS. 4 to 6, the other buffer portions 21, 23, and 24 have a similar layout. As a circuit, the buffer portion 22 has a configuration of inverters 22a and 22b serially connected.

In the buffer portion 22, power supply lines 11a and 11b supplying VDD and power supply lines 12a and 12b supplying VSS are alternately placed in the Y direction. In a height region HR1 between the power supply lines 12a and 11a, n-type transistors and p-type transistors are placed in this order from above in the figure. In a height region HR2 between the power supply lines 11a and 12b, p-type transistors and n-type transistors are placed in this order from above in the figure. In a height region HR3 between the power supply lines 12b and 11b, n-type transistors and p-type transistors are placed in this order from above in the figure. The transistors are fin transistors, in which three rows of fins 32 that are to be the channel regions and nodes of the transistors are placed. Local interconnects 33 are connected to the nodes of the transistors.

In the height regions HR1, HR2, and HR3, the n-type transistors and the p-type transistors arranged side by side in the Y direction have common gate interconnects 31. One node of each n-type transistor is connected to the power supply line 12a or 12b supplying VSS through the corresponding local interconnect 33. One node of each p-type transistor is connected to the power supply line 11a or 11b supplying VDD through the corresponding local interconnect 33.

Three columns of transistors from the left in the figure constitute the front inverter 22a, and the remaining columns of transistors, i.e., eight columns of transistors from the right in the figure constitute the rear inverter 22b.

In the height regions HR1, HR2, and HR3, signal lines extending in the X direction are formed in the M0 interconnect layer, and signal lines extending in the Y direction are formed in the M1 interconnect layer. These signal lines will be described with reference to FIG. 6, taking the height region HR2 as an example.

A signal line 41 is connected to the gate interconnects 31 of the three columns of transistors from the left in the figure, which constitute the front inverter 22a, through contacts. A signal line 42a is connected to the other nodes (nodes not connected to VDD) of the p-type transistors constituting the front inverter 22a through contacts. A signal line 42b is connected to the other nodes (nodes not connected to VSS) of the n-type transistors constituting the front inverter 22a through contacts.

A signal line 43 is connected to the gate interconnects 31 of the eight columns of transistors from the right in the figure, which constitute the rear inverter 22b, through contacts. A signal line 44a is connected to the other nodes (nodes not connected to VDD) of the p-type transistors constituting the rear inverter 22b through contacts. A signal line 44b is connected to the other nodes (nodes not connected to VSS) of the n-type transistors constituting the rear inverter 22b through contacts.

In the M1 interconnect layer, a signal line 15 is placed between the power supply lines 13a and 14a and connected to the signal line 41 in the M0 interconnect layer. That is, the signal line 15 is electrically connected to the gate interconnects 31 of the transistors constituting the front inverter 22a. The signal line 15 corresponds to the input node of the buffer portion 22.

A signal line 16a is placed between the power supply lines 13b and 14b, a signal line 16b is placed between the power supply lines 13b and 14c, and a signal line 16c is placed between the power supply lines 14c and 13c. The signal lines 16a, 16b, and 16c are connected to the signal lines 44a and 44b in the M0 interconnect layer. That is, the signal lines 16a, 16b, and 16c are electrically connected to the other nodes of the p-type transistors constituting the rear inverter 22b and to the other nodes of the n-type transistors constituting the rear inverter 22b. The signal lines 16a, 16b, and 16c correspond to the output node of the buffer portion 22.

A signal line 17 is placed between the power supply lines 13a and 14b and connected to the signal lines 42a, 42b, and 43 in the M0 interconnect layer. That is, the signal line 17 is electrically connected to the other nodes of the p-type transistors constituting the front inverter 22a, the other nodes of the n-type transistors constituting the front inverter 22a, and the gate interconnects 31 of the transistors constituting the rear inverter 22b. The signal line 17 corresponds to the connection node between the front inverter 22a and the rear inverter 22b.

Figure 7:
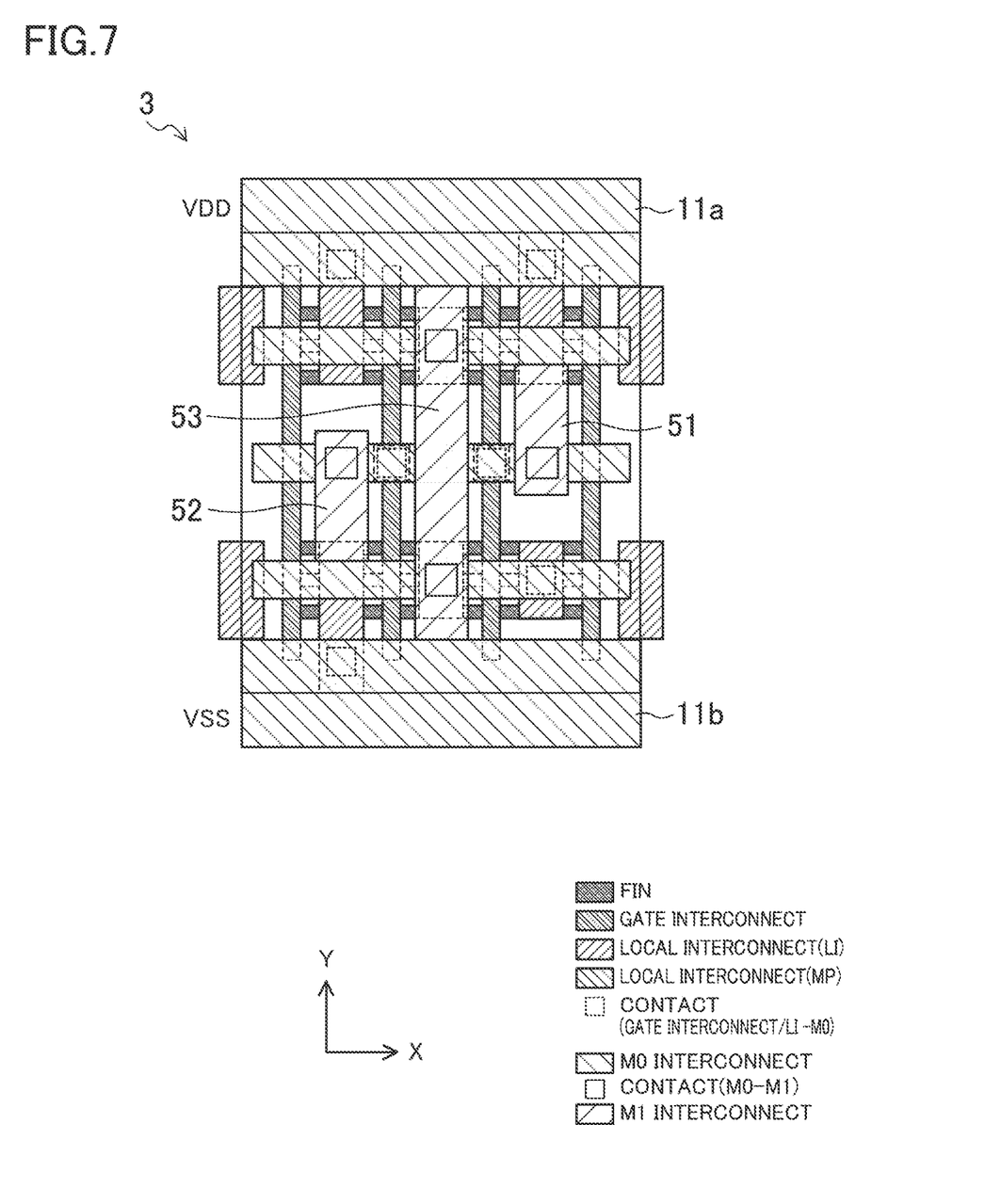
FIG. 7 shows a layout example of a normal standard cell.

FIG. 7 shows a layout example of a normal standard cell, which specifically shows a layout of the 2-input NAND cell 3 in FIG. 1. As shown in FIG. 7, fin transistors are formed between a power supply line 11a supplying VDD and a power supply line 11b supplying VSS. In the M1 interconnect layer, signal lines 51, 52, and 53 extending in the Y direction are formed. The signal line 51 corresponds to an input A, the signal line 52 corresponds to an input B, and the signal line 53 corresponds to an output YB.

Figure 8A:
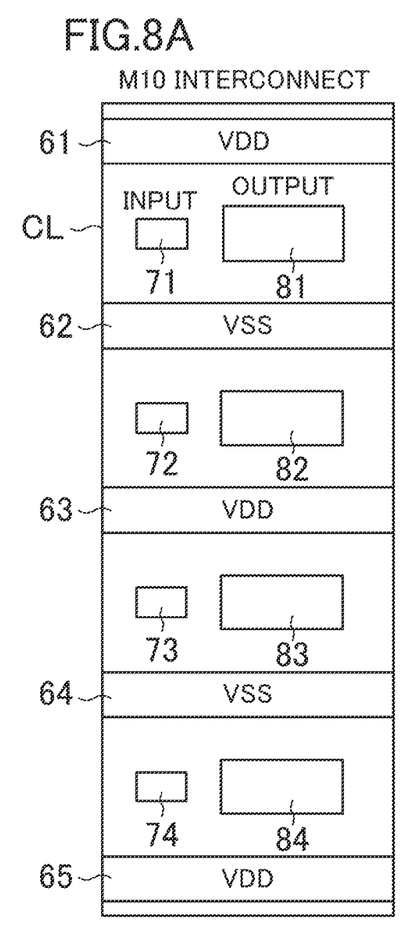
FIGS. 8A-8C show layouts of upper-layer lines of the clock buffer cell of FIG. 3.
Figure 8B:
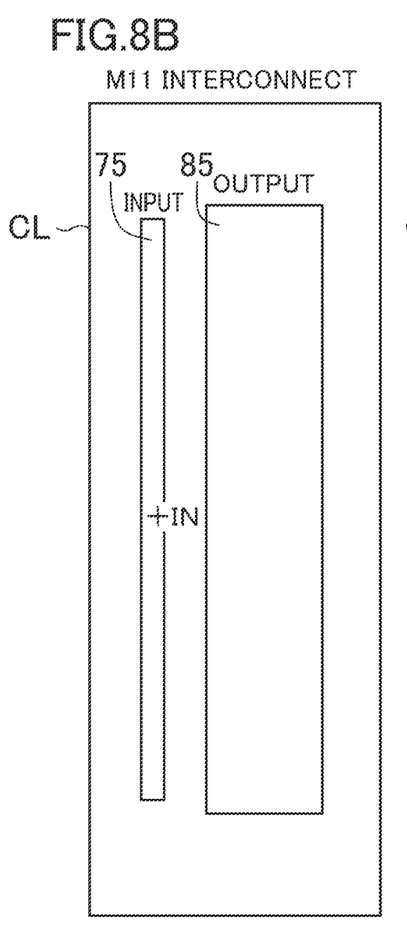
Figure 8C:
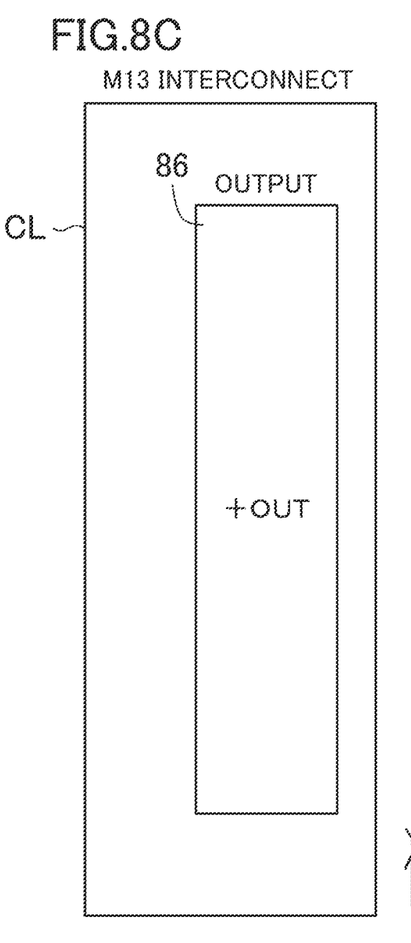

FIGS. 8A-8C show layout examples of upper-layer lines of the clock buffer cell of FIG. 3, in which FIG. 8A shows an M10 interconnect layer, FIG. 8B shows an M11 interconnect layer, and FIG. 8C shows an M13 interconnect layer. The M10, M11, and M13 interconnect layers are greater in film thickness than the M0 and M1 interconnect layers. For example, the film thicknesses of the M10, M11, and M13 interconnect layers are four to five times those of the M0 and M1 interconnect layers.

As shown in FIG. 8A, in the M10 interconnect layer, power supply lines 61, 62, 63, 64, and 65 extending in parallel in the X direction are formed. The power supply lines 61, 63, and 65 supply VDD, and the power supply lines 62 and 64 supply VSS. The power supply lines 61 to 65 are greater in width than the power supply lines 11 and 12 in the M0 interconnect layer. The power supply lines 61 to 65 are connected to inter-block power mains formed in the same layer or in an upper layer.

The power supply lines 61, 63, and 65 are electrically connected to the power supply lines 13a, 13b, and 13c in the M1 interconnect layer through a stacked via structure, for example, formed in M2 to M9 interconnect layers. The power supply lines 62 and 64 are electrically connected to the power supply lines 14a, 14b, and 14c in the M1 interconnect layer through a stacked via structure, for example, formed in the M2 to M9 interconnect layers. Note that the structure for connecting the power supply lines in the M10 interconnect layer and the power supply lines in the M1 interconnect layer is not limited to the stacked via structure. For example, meshed power supply lines in which the directions of lines are changed every layer may be formed.

In the M10 interconnect layer, also, signal lines 71, 72, 73, and 74 for input and signal lines 81, 82, 83, and 84 for output are formed. The signal lines 71, 72, 73, and 74 are connected to the signal lines 15 in the M1 interconnect layer, which serve as the input nodes of the buffer portions 21, 22, 23, and 24, respectively, through the M2 to M9 interconnect layers. The signal lines 81, 82, 83, and 84 are connected to the signal lines 16a, 16b, and 16c in the M1 interconnect layer, which serve as the output nodes of the buffer portions 21, 22, 23, and 24, respectively, through the M2 to M9 interconnect layers. The signal lines in the M10 interconnect layer and the signal lines in the M1 interconnect layer are connected through a stacked via structure, for example.

As shown in FIG. 8B, in the M11 interconnect layer, a signal line 75 including the input terminal and a signal line 85 for output are formed. The signal line 75 extends in the Y direction and is connected to the signal lines 71, 72, 73, and 74 in the M10 interconnect layer. The signal line 85 extends in the Y direction and is connected to the signal lines 81, 82, 83, and 84 in the M10 interconnect layer. As shown in FIG. 8C, in the M13 interconnect layer, a signal line 86 including the output terminal is formed. The signal line 86 extends in the Y direction and is connected to the signal line 85 in the M11 interconnect layer through a line in an M12 interconnect layer. The signal line 75 in the M11 interconnect layer corresponds to the line 2a in FIG. 1, and the signal line 86 in the M13 interconnect layer corresponds to the line 2b in FIG. 1.

In the signal line 86, the output terminal (+OUT) is located in the center in the Y direction. In the signal line 75, the input terminal (+IN) is located in the center in the Y direction. When viewed in plan, the output terminal (+OUT) and the input terminal (+IN) are located between the buffer portion 22 and the buffer portion 23. Also, the signal line 86 including the output terminal is greater in width (size in the X direction) than the signal line 75 including the input terminal.

Functions and Effects of Embodiment

In this embodiment, the clock buffer cell 1, 2 includes the power supply lines 11 and 12 in the M0 interconnect layer as do normal cells such as the 2-input NAND cell 3. In the design of the semiconductor integrated circuit device, therefore, by placing the clock buffer cell similarly to the placement of normal cells, power supply lines in the M0 interconnect layer are mutually connected. This facilitates the design.

The clock buffer cell 1, 2 is a multi-height cell, having a plurality of power supply lines 11 for VDD and a plurality of power supply lines 12 for VSS. Therefore, since the current can be dispersed into a plurality of power supply lines, the power supply voltage drop can be reduced.

The clock buffer cell 1, 2 includes the power supply lines 13a, 13b, 13c, 14a, 14b, and 14c extending in the Y direction formed in the M1 interconnect layer, and the power supply lines 13a, 13b, 13c, 14a, 14b, and 14c are connected to the power supply lines 61, 62, 63, 64, and 65 in the M10 interconnect layer. Therefore, since the power supply lines can be connected to the upper-layer power mains with low resistance, the power supply voltage drop can be reduced.

The signal lines 15 serving as the input nodes formed in the buffer portions 21 to 24 are not mutually connected among the buffer portions 21 to 24, but separated from one another. Similarly, the signal lines 16a, 16b, and 16c serving as the output nodes formed in the buffer portions 21 to 24 are not mutually connected among the buffer portions 21 to 24, but separated from one another. This reduces occurrence of the electromigration problem. More specifically, if the signal lines 15 are connected among the buffer portions 21 to 24 forming one line, a large current will flow to this thin and long line. In particular, a large current will flow in the center of the line in the Y direction. This will increase the possibility of occurrence of the electromigration problem. By contrast, by separating the signal lines 15 from one another among the buffer portions 21 to 24, the electromigration problem is controlled. This also applies to the signal lines 16a, 16b, and 16c: by separating these from one another among the buffer portions 21 to 24, the electromigration problem is controlled.

The clock buffer cell 1, 2 receives power supply from the power supply lines 11 and 12 in the M0 interconnect layer as do normal cells, and moreover receives power supply from the power supply lines 61 to 65 in the M10 interconnect layer. The M10 interconnect layer is greater in film thickness than the M0 interconnect layer, and the power supply lines 61 to 65 are greater in width than the power supply lines 11 and 12. As a result, the resistance value of the power supply lines 61 to 65 in the M10 interconnect layer is significantly low compared with that of the power supply lines 11 and 12 in the M0 interconnect layer. Therefore, even when a large current flows to the clock buffer cell 1, 2, such a current is mainly supplied from the M10 power supply lines 61 to 65 lower in resistance value. This reduces the power supply voltage drop, and moreover can minimize the influence on power supplies for the surrounding normal cells.

In the clock buffer cell 1, 2, the width of the line 86 including the output terminal is greater than that of the line 75 including the input terminal. Here, the load capacitance of an output terminal includes a large interconnect load capacitance by a line connected to the output terminal and an input load capacitance of a next-stage clock buffer cell. On the other hand, the load capacitance of an input terminal includes only an input load capacitance of the clock buffer cell in question. Therefore, the current flowing to the output terminal is larger than that flowing to the input terminal. Therefore, by increasing the width of the line 86 including the output terminal, the electromigration problem at the output terminal can be controlled.

In the clock buffer cell 1, 2, the input terminal (+IN) and the output terminal (+OUT) are located in the center in the Y direction. With this, the electromigration problem can be controlled. For example, currents flow to the output terminal from the four buffer portions 21 to 24. Assuming that the current flowing from one buffer portion is 1 Ibuf, a total of 4 Ibuf's is to flow to the output terminal. In this case, when the output terminal is located between the buffer portion 22 and the buffer portion 23 as viewed in plan as in this embodiment, a current of 2 Ibuf's flows from the upper side in the figure, and a current of 2 Ibuf's flows from the lower side in the figure, to the output terminal. By contrast, if the output terminal is placed at the upper end of the line 86 in the figure, for example, a current of 4 Ibuf's will flow from the lower side in the figure to the output terminal. This will make the electromigration problem more likely to occur. That is, by placing the output terminal in the center in the Y direction as in this embodiment, the electromigration problem can be controlled. Similarly, by placing the input terminal in the center in the Y direction, the electromigration problem can be controlled.

In the clock buffer cell 1, 2, the output terminal is in an interconnect layer located above the input terminal. By placing the input terminal and the output terminal in different interconnect layers from each other, routing for the input terminal and that for the output terminal are facilitated in the first place. For example, as shown in FIG. 1, the input terminal 1*a* in the M11 interconnect layer is connected to the interconnect 4 in the M13 interconnect layer through the interconnect 5 in the M12 interconnect layer. This avoids interconnect congestion in the M13 interconnect layer in the neighborhood of the output terminal 1*b*. In addition, as described above, the current flowing to the output terminal is large, making the electromigration problem more likely to occur. To cope with this problem, by placing the output terminal in an upper layer so that the routing for connection with the outside can be achieved through a smaller number of interconnect layers, it is possible to minimize the number of lines in which the electromigration problem may occur.

As described above, according to this embodiment, in the clock buffer cell 1, 2, the metal interconnect 1*b*, 2*b*, 86 including the output terminal is in a layer above the metal interconnect 1*a*, 2*a*, 75 including the input terminal, and is greater in width. In a clock buffer, the output terminal is larger in load capacitance than the input terminal, causing a larger current to flow to the output terminal than to the input terminal, and therefore the electromigration problem is more likely to occur at the output terminal. In view of this, by placing the output terminal in a layer above the input terminal, the number of transfers from one interconnect layer to another in the routing of connected lines is reduced, whereby the number of lines in which the electromigration problem may occur can be reduced. Also, by making the width of the output terminal greater than that of the input terminal, the electromigration problem at the output terminal can be controlled.

The clock buffer cell 1, 2 receives power supply from the power supply line 11, 11*a* in the M0 interconnect layer as does the standard cell 3. The clock buffer cell 1, 2 also receives power supply from the power supply lines 61, 63, and 65 in the M10 interconnect layer. The power supply lines 61, 63, and 65 are greater in width than the power supply line 11*a*. Therefore, when a large current flows to the clock buffer cell 1, 2, such a current is mainly supplied from the power supply lines 61, 63, and 65 that are low in resistance value. This minimizes the power supply voltage drop and also can minimize the influence on the power supply for the standard cell 3.

The clock buffer cell 1, 2 is formed in a region where the power supply lines 11 supplying VDD and the power supply lines 12 supplying VSS are alternately placed. The clock buffer cell 1, 2 includes a plurality of buffer portions 21, 22, 23, and 24 arranged in line in the Y direction vertical to the X direction in which the power supply lines 11 extend. The buffer portions 21 to 24 each include the input node 15 electrically connected to the input terminal of the clock buffer cell 1, 2 and the output nodes 16*a*, 16*b*, and 16*c* electrically connected to the output terminal of the clock buffer cell 1, 2. The output terminal of the clock buffer cell 1, 2 is formed in the M13 interconnect layer located above the M1 interconnect layer in which the input node 15 and the output nodes 16*a*, 16*b*, and 16*c* of each of the buffer portions 21 to 24 are formed, and is located near the center of the plurality of buffer portions 21 to 24 in the Y direction as viewed in plan. With this configuration, the currents from the buffer portions 21 to 24 flow to the output terminal roughly uniformly from both sides in the Y direction, with no occurrence of a larger current flowing from one side. Therefore, the electromigration problem can be controlled.

In the above embodiment, the clock buffer cell 1, 2 is a multi-height cell having a height 22 times that of the normal cells C, and has four buffer portions 21 to 24 having a height three times that of the normal cells C. However, the configuration of the clock buffer cell 1, 2 is not limited to this.

Figure 9:
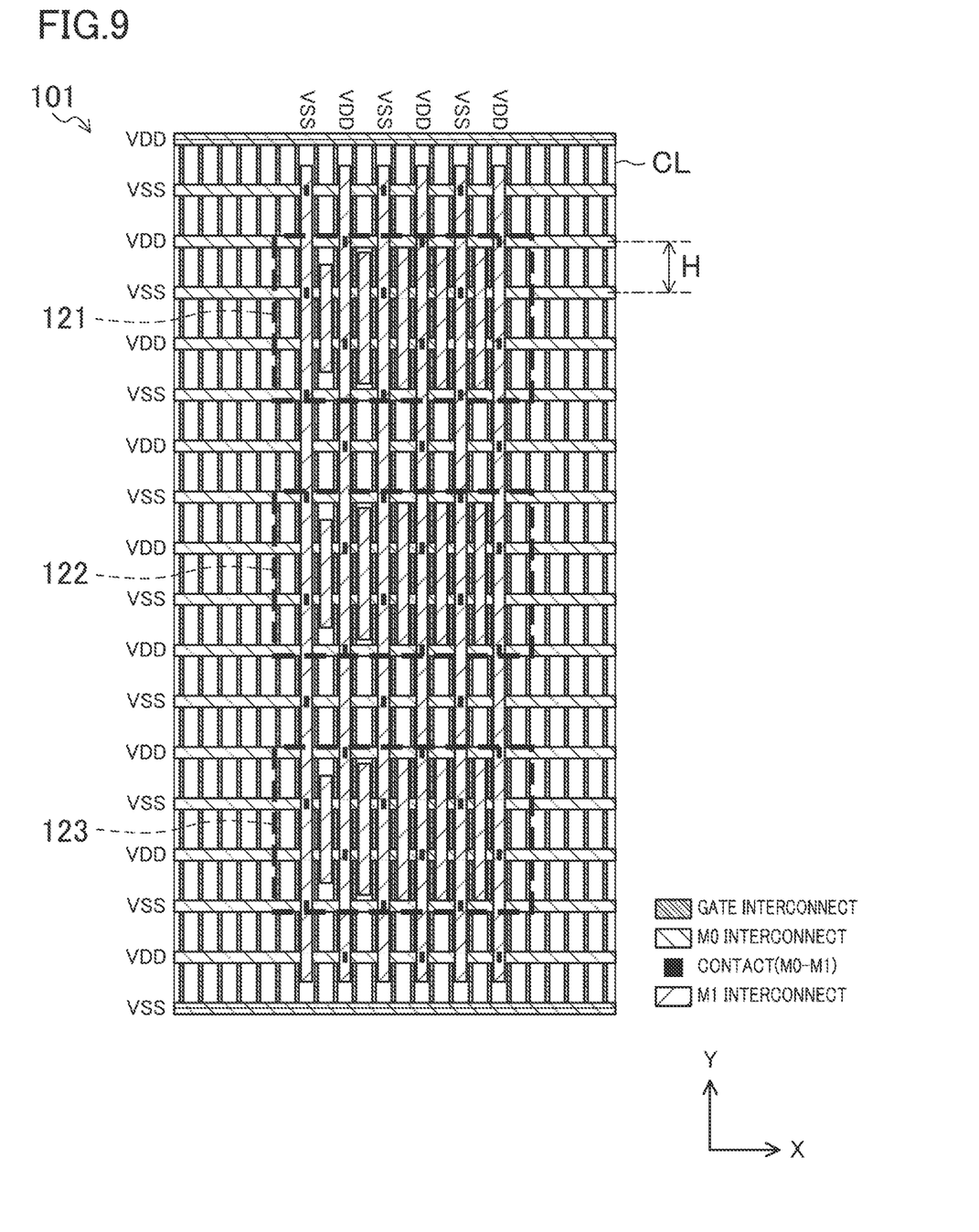
FIG. 9 shows another layout example of the clock buffer cell.

FIG. 9 is an another layout example of the clock buffer cell. A clock buffer cell 101 of FIG. 9 is a multi-height cell having a height 17 times that of the normal cells C, and has three buffer portions 121 to 123 having a height three times that of the normal cells C. In the configuration of FIG. 9, the input terminal and output terminal of the clock buffer cell 101 only need to be placed at positions overlapping the center buffer portion 122 as viewed in plan. With this placement, similar functions and effects to those in the above embodiment can be obtained.

That is, when the number of buffer portions of the clock buffer cell according to this embodiment is even (2N: N is a positive integer), the input and output terminals only need to be placed between the N-th buffer portion and the (N+1)th buffer portion from one side of the cell in the Y direction. When the number of buffer portions is odd (2N+1: N is a positive integer), the input and output terminals only need to be placed at positions overlapping the (N+1)th buffer portion from one side of the cell in the Y direction.

According to the present disclosure, in a semiconductor integrated circuit device provided with a clock buffer cell, the problems of a power supply voltage drop and electromigration can be controlled without complicating the configuration of power supply lines. The present disclosure is therefore useful for improvement in the performance of LSI, for example.

What is claimed is:

1. A semiconductor integrated circuit device, comprising a clock buffer cell that is a standard cell transmitting a clock signal, having an input terminal and an output terminal,
    wherein
    a first metal interconnect including the output terminal is located in a layer above a second metal interconnect including the input terminal and greater in width than the second metal interconnect.

2. The semiconductor integrated circuit device of claim 1, comprising
    a second standard cell implementing a logical function,
    wherein
    the first and second metal interconnects are located in layers above input and output terminals of the second standard cell.

3. The semiconductor integrated circuit device of claim 1, wherein
    the clock buffer cell includes
        a plurality of buffer portions arranged in line in a second direction, each having an input node electrically connected to the input terminal and an output node electrically connected to the output terminal,
    the input nodes and the output nodes are formed in a first metal interconnect layer, and
    the output terminal is formed in a second metal interconnect layer above the first metal interconnect layer, and, when the plurality of buffer portions are 2N (N is a positive integer) buffer portions, the output terminal is located between the N-th buffer portion and the (N+1)th buffer portion from one side in the second direction, and when the plurality of buffer portions are (2N+1) buffer portions, the output terminal is located at a position overlapping the N-th buffer portion from one side in the second direction, as viewed in plan.

4. A semiconductor integrated circuit device, comprising:
    a clock buffer cell that is a standard cell transmitting a clock signal, wherein;

the clock buffer cell includes:
  a first power supply line supplying a first power extending in a first direction in a first metal interconnect layer; and
  a second power supply line formed in a second metal interconnect layer above the first metal interconnect layer and electrically connected to the first power supply line, and
the second power supply line is greater in width than the first power supply line.

5. The semiconductor integrated circuit device of claim 4, wherein
the second power supply line is greater in film thickness than the first power supply line.

6. The semiconductor integrated circuit device of claim 4, wherein
the second power supply line extends in the first direction.

7. The semiconductor integrated circuit device of claim 4, wherein
the first power supply line comprises a plurality of first power supply lines,
the device comprises a plurality of third power supply lines supplying a second power extending in the first direction in the first metal interconnect layer, the plurality of first power supply lines and the plurality of third power supply lines being alternately placed in a second direction vertical to the first direction, and
the clock buffer cell is formed in a region in which the plurality of first power supply lines and the plurality of third power supply lines are placed, and includes a plurality of height regions each being a region formed between the first and third power supply lines adjacent to each other in the second direction.

8. The semiconductor integrated circuit device of claim 7, comprising
a fourth power supply line formed in a third metal interconnect layer above the first metal interconnect layer and below the second metal interconnect layer, extending in the second direction and supplying the first power,
wherein
the fourth power supply line is electrically connected to the plurality of first power supply lines.

9. A semiconductor integrated circuit device, comprising:
a plurality of first power supply lines supplying a first power extending in a first direction;
a plurality of second power supply lines supplying a second power extending in the first direction, the plurality of first power supply lines and the plurality of second power supply lines being alternately placed in a second direction vertical to the first direction; and
a clock buffer cell that is a standard cell transmitting a clock signal, formed in a region in which the plurality of first power supply lines and the plurality of second power supply lines are placed, the clock buffer cell having an input terminal and an output terminal,
wherein
the clock buffer cell includes
  a plurality of buffer portions arranged in line in the second direction, each having an input node electrically connected to the input terminal and an output node electrically connected to the output terminal,
the input nodes and the output nodes are formed in a first metal interconnect layer, and
the output terminal is formed in a second metal interconnect layer above the first metal interconnect layer, and, when the plurality of buffer portions are 2N (N is a positive integer) buffer portions, the output terminal is located between the N-th buffer portion and the (N+1)th buffer portion from one side in the second direction, and when the plurality of buffer portions are (2N+1) buffer portions, the output terminal is located at a position overlapping the N-th buffer portion from one side in the second direction, as viewed in plan.

10. The semiconductor integrated circuit device of claim 9, wherein
the output nodes of the plurality of buffer portions are separated from each other in the first metal interconnect layer, and
the device comprises a single signal line formed in a third metal interconnect layer above the first metal interconnect layer and below the second metal interconnect layer, electrically connected to the output nodes of the plurality of buffer portions.

11. The semiconductor integrated circuit device of claim 9, wherein
the plurality of buffer portions each include a plurality of height regions each being a region formed between the first and second power supply lines adjacent to each other in the second direction.

12. The semiconductor integrated circuit device of claim 9, wherein
the input terminal is formed in a fourth metal interconnect layer above the first metal interconnect layer, and, when the plurality of buffer portions are 2N buffer portions, the input terminal is located between the N-th buffer portion and the (N+1)th buffer portion from one side in the second direction, and when the plurality of buffer portions are (2N+1) buffer portions, the input terminal is located at a position overlapping the N-th buffer portion from one side in the second direction, as viewed in plan.

13. The semiconductor integrated circuit device of claim 9, wherein
a first metal interconnect including the output terminal is located in a layer above a second metal interconnect including the input terminal and greater in width than the second metal interconnect.

* * * * *